United States Patent
Haspeslagh (10) Patent No.: US 6,580,120 B2
(45) Date of Patent: Jun. 17, 2003

(54) TWO BIT NON-VOLATILE ELECTRICALLY ERASABLE AND PROGRAMMABLE MEMORY STRUCTURE, A PROCESS FOR PRODUCING SAID MEMORY STRUCTURE AND METHODS FOR PROGRAMMING, READING AND ERASING SAID MEMORY STRUCTURE

(75) Inventor: Luc Haspeslagh, Lubbeek-Linden (BE)

(73) Assignee: Interuniversitair Microelektronica Centrum (IMEC VZW), Leuven (BE)

( * ) Notice: Subject to any disclaimer, the term of this patent is extended or adjusted under 35 U.S.C. 154(b) by 0 days.

(21) Appl. No.: 10/156,427

(22) Filed: May 28, 2002

(65) Prior Publication Data

US 2003/0006450 A1 Jan. 9, 2003

Related U.S. Application Data

(60) Provisional application No. 60/296,618, filed on Jun. 7, 2001.

(51) Int. Cl.[7] .............................................. H01L 29/788
(52) U.S. Cl. ........................ 257/315; 257/319; 257/321
(58) Field of Search ................................. 257/315, 319, 257/322

(56) References Cited

U.S. PATENT DOCUMENTS 5,969,383 A    10/1999 Chang et al.
6,137,134 A  * 10/2000 Nakagawa
6,160,297 A  * 12/2000 Shimizu et al.

FOREIGN PATENT DOCUMENTS

EP    0387936 A1  *  9/1990
EP    0573169 A1  * 12/1993
WO    99 07000       2/1999

OTHER PUBLICATIONS

"Twin MONOS Cell With Dual Control Gates", published in the proceedings of the "VLSI Symposium" 2000.

* cited by examiner

Primary Examiner—Stephen D. Meier
(74) Attorney, Agent, or Firm—McDonnell Boehnen Hulbert & Berghoff (57) ABSTRACT

A planar high-density EEPROM split gate memory structure, is formed using two poly-layers and chemical-mechanical-polishing processes. Stripes of contiguous poly lines, alternately formed in one of the two poly-layers, constitute the memory structure. Source and drain regions are formed self-aligned to the outer borders of this memory structure. Depending on the biasing scheme a poly line is used as the select gate of the memory cell while an adjacent poly line is used as program gate, so to have charge stored underneath this adjacent poly line using source-side-injection of charge carriers. The other poly lines are biased to form conductive channels between the select and program gate to the source and drain regions. These conductive channels form soft source and drain regions next to the select and program gate in use.

11 Claims, 12 Drawing Sheets

TWO BIT NON-VOLATILE ELECTRICALLY ERASABLE AND PROGRAMMABLE MEMORY STRUCTURE, A PROCESS FOR PRODUCING SAID MEMORY STRUCTURE AND METHODS FOR PROGRAMMING, READING AND ERASING SAID MEMORY STRUCTURE

REFERENCE TO RELATED APPLICATION

This application claims priority benefits to U.S. provisional application Serial No. 60/296,618, filed on Jun. 7, 2001. This application incorporates by reference U.S. provisional application Serial No. 60/296,618 in its entirety.

FIELD OF THE INVENTION

The present invention relates generally to multi-bit semiconductor memory devices and more particularly to two-bit electrically erasable and programmable non-volatile memory devices. The present invention uses a trapping dielectric for charge retention.

BACKGROUND OF THE INVENTION

EEPROM (Electrically Erasable and Programmable Read Only Memory) offers the opportunity of electrically storing and removing data. The data stored in the EEPROM is represented by charge injected either onto a floating gate or into charge trapping sites in a dielectric or charge-trapping layer, forming part of a FET (Field Effect Transistor) structure comprised by the EEPROM. This electrical charge introduced in the FET structures influences the threshold voltage of at least a part of the FET structure. The charge, and hence the data associated with it, will be retained even when the electrical power to the memory is removed. Therefore these devices are also labeled as NVM (Non Volatile Memory) devices.

U.S. Pat. No. 5,969,383 entitled "Split gate memory device and method for accessing the same", hereby incorporated by reference in its entirety, discloses a single bit EEPROM in which a split gate FET functions as a memory cell. Each memory cell contains a control gate (32) formed on top of an Oxide-Nitride-Oxide (ONO) stack (25) and, adjacent to but electrically insulated from this control gate (32), a select gate (16) on top of a dielectric (14). Source (36) and drain (22) regions are formed self-aligned respectively to this control gate and the select gate. The programming of the memory cell is done by the so-called source-side-injection (SSI) mechanism. The select gate is biased to form a conductive channel in the semiconductor region (38) underneath the select gate dielectric (14) to conduct electrons from the drain region onwards. The control gate is biased to have the corresponding underlying semiconductor region depleted and to attract the charge carriers, originating from the drain region, in the conductive channel. The attracted carriers are injected into and stored on the ONO stack (24) underneath the control gate (32). Reading and writing of the memory cell are done in opposite directions to obtain high read-out sensitivity.

PCT application WO0990700 entitled "Two bit non-volatile electrically erasable and programmable semiconductor memory cell utilizing asymmetrical charge trapping", hereby incorporated by reference in its entirety, discloses a dual bit flash EEPROM, in which a single FET functions as a memory cell. Each memory cell contains a gate stack formed by a conductive layer (24) on top of a dielectric sandwich and source (14)/drain (16) regions formed self-aligned to this gate stack. The middle dielectric layer (20) of this dielectric sandwich acts as a charge-trapping layer. Within this charge-trapping layer, charge can be stored at two opposite sides, respectively at the source and at the drain side, instead of being distributed along the charge-trapping layer, as was the case in U.S. Pat. No. 5,969,383. Each side corresponds to a single bit of data, leading to two charge storage points under a single word line (24). An Oxide-Nitride-Oxide (ONO) stack can be used as such dielectric sandwich. The non-conductive nitride prevents, depending on its dimensions and process-conditions, the exchange of charge being stored at two opposite charge storage points present in the nitride layer. The programming of each bit of the two-bit memory cell is done by the so-called channel hot electron (CHE) injection. Reading and writing of the memory cell are also done in opposite directions or in an asymmetrical way In "Twin MONOS cell with dual control gates", published in the proceedings of the "VLSI Symposium" 2000, hereby incorporated by reference in its entirety, Hayashi et al. disclose a EEPROM memory cell consisting of two MONOS memory elements. Each memory element shares one common word or select gate (WG) with its neighbouring memory element. Each memory element further contains a control gate (CG) and a diffusion line (D). Two neighbouring memory cells will have the control gate and the diffusion line in common. The cross-sectional view of a "Twin MONOS"—memory cell very much resembles the "split gate" memory cell of U.S. Pat. No. 5,969,383 in that on both sides of the select gate (16) a control gate (32) is formed. Both source (36) and drain (22) regions are then formed self-aligned to their corresponding control gates (32, 35). Each memory element is capable of storing a single bit of data. The programming of the memory element is done by the so-called source-side-injection (SSI) mechanism. Reading and writing of the memory cell are also done in opposite directions or in asymmetrical way.

Aims of the Invention

An aim, in an aspect of the invention, is to disclose a non-volatile memory structure and a method for accessing the memory structure that is power efficient and suitable for low-power applications.

Another aim, in an aspect of the invention, is to disclose a non-volatile memory structure that is simple and inexpensive to fabricate.

Yet another aim, in an aspect of the invention, is to disclose a non-volatile memory structure that is most area efficient.

Still another aim, in an aspect of the invention, is to disclose a non-volatile memory structure capable of storing at least two bits of data. Each bit of data can be multi-valued, i.e. a bit can have different charge contents, each charge content corresponding to a different data value.

Another aim, in an aspect of the invention, is to disclose a non-volatile memory structure that requires a reduced amount of charge to achieve a detectable change of threshold voltage.

SUMMARY OF THE INVENTION

In a first aspect of the invention a memory device and a method to manufacture this memory structure is disclosed. This method of forming a two-bit NVM EEPROM structure comprising the steps of:

defining a multitude of active area lines, separated by isolating field oxide regions;

depositing on top of these active area lines a first cell stack, comprising a first isolating dielectric, a dielectric capable of storing and retaining electric charge, a second isolating dielectric and a first conducting layer;

patterning the deposited first cell stack to form a multitude of lines at equidistant spacing and oriented substantially perpendicular to the active area lines, preferably the multitude of patterned first cell stacks comprises at least two lines;

filling the spacing in between the equidistant patterned first cell stacks with a second cell stack, comprising a first isolating dielectric, a dielectric capable of storing and retaining electric charge, an second isolating dielectric and a second conducting layer, the second cell stack being electrically insulated from the first cell stack;

planarizing the second cell stack thereby removing the second conducting layer outside the spacings between the equidistant patterned first cell stacks, optionally forming self-aligned to the array of first and second cell stacks spacers and junctions, thereby defining a channel region underneath the array of abutted first and second cell stacks.

The memory structure according to the present invention is an array of 2-bit NVM memory cells comprising a first sequence of parallel isolated active area regions formed in a substrate, a second sequence of planar adjoining cell stacks, being positioned above and substantially perpendicular to said first sequence of parallel isolated active area regions, junctions formed self-aligned to and at opposite sides of said second sequence of planar adjoining cell stacks, said planar adjoining cell stacks being isolated from each other and comprising a conductive gate and a charge-storing dielectric layer, sandwiched between two dielectric layers, and comprising two regions, each region capable of storing 1 bit.

In a second aspect of the invention methods for programming, reading and erasing the memory structure according to the present invention are disclosed. A method for programming and reading a bit in a two-bit memory cell stack, in an array of two-bit non-volatile memory cells, said array comprising a first sequence of parallel isolated active area regions formed in a substrate, a second sequence of planar adjoining cell stacks, being positioned above and substantially perpendicular to said first sequence of parallel isolated active area regions, junctions formed self-aligned to and at opposite sides of said second sequence of planar adjoining cell stacks, said planar adjoining cell stacks being isolated from each other and comprising a conductive gate and a charge-storing dielectric layer, sandwiched between two dielectric layers, and comprising two regions, each region capable of storing 1 bit, said method comprising the steps of:
  selecting a memory cell stack,
  programming in a forward direction a bit in one of said two regions of said memory cell stack, by grounding one junction, positioned at the same side as said one of said two regions and applying a high potential to a junction, positioned at the opposite side of said one of said two regions; applying a high voltage to all cell stacks except to the cell stack neighbouring said one of said two regions to invert the active area regions underneath said biased cell stacks; and, biasing said neighbouring cell stack at a voltage slightly above the thresholdvoltage of said neighbouring cell stack to thereby inject electrical charge of a first type into said one of said two regions such that the threshold voltage of said selected cell stack is at least at predetermined level when said memory cell stack is read in the same direction from which it was programmed;
  reading said programmed bit in forward direction; by grounding said junction, positioned at the same side as said one of said two regions and applying a low potential to said junction, positioned at the opposite side of said one of said two regions; applying a high voltage on all cell stacks except to said selected memory cell stack to invert the active area regions underneath said biased cell stacks; and, sensing to what extent the threshold voltage of said selected memory cell is changed by said injected electrical charge.

A method for programming, reading and erasing a bit in a two-bit memory cell stack, in an array of two-bit non-volatile memory cells, said array comprising a first sequence of parallel isolated n-type active area regions formed in a substrate, a second sequence of planar adjoining cell stacks, being positioned above and substantially perpendicular to said first sequence of parallel isolated active area regions, junctions formed self-aligned to and at opposite sides of said second sequence of planar adjoining cell stacks, said planar adjoining cell stacks being isolated from each other and comprising a conductive gate and a charge-storing dielectric layer, sandwiched between two dielectric layers, and comprising two regions, each region capable of storing 1 bit, said method comprising the steps of:
  selecting a memory cell stack,
  programming in a forward direction a bit in one of said two regions of said memory cell stack, the step of programming by
    grounding one junction, positioned at the same side as said one of said two regions and applying a high negative potential to a junction, positioned at the opposite side of said one of said two regions;
    applying a high negative voltage to all cell stacks except to the cell stack neighbouring said one of said two regions to invert the n-type active area regions underneath said biased cell stacks; and,
    biasing said neighbouring cell stack at a negative voltage slightly more negative then the threshold-voltage of said neighbouring cell stack to thereby inject positive electrical charge into said one of said two regions such that the threshold voltage of said selected cell stack is at least at predetermined level when said memory cell stack is read in the same direction from which it was programmed;
  reading said programmed bit in forward direction, the step of reading by
    grounding said junction, positioned at the same side as said one of said two regions and applying a low negative potential to said junction, positioned at the opposite side of said one of said two regions;
    applying a high negative voltage on all cell stacks except to said selected memory cell stack to invert the n-type active area regions underneath said biased cell stacks; and,
    sensing to what extent the threshold voltage of said selected memory cell is changed by said injected electrical charge;
  erasing said programmed bit, the step of erasing by:
    biasing all cell stacks to a large voltage of a first sign, the step of erasing
    biasing said junctions to a voltage of an opposite sign that is zero volt or larger; and, tunneling negative electrical charge through one of said two dielectric layers, at least into said one of said two regions.

BRIEF DESCRIPTION OF THE DRAWINGS

Exemplary embodiments of the invention and of the use of the invention are shown in the drawings. The drawings are schematic representations of the invention and therefore the dimensions and the relative dimensions do not correspond to actual reductions to practice of the invention.

DETAILED DESCRIPTION

The invention is described in the sequel through a detailed description of several embodiments of the invention. Other embodiments of the invention can be configured according to the knowledge of persons skilled in the art without departing from the true spirit of the invention, the invention being limited only by the terms of the appended claims.

In the remainder of the text, the voltage levels indicated are assumed to be independent of the power supply voltage. The power supply voltages supplied to the chip embodying the present EEPROM memory structure may vary while the voltages applied to the terminals of the memory structure will be supplied from regulated voltage sources and set to the desired value. Although the EEPROM of the present invention is capable of storing two bits of data at their corresponding storage site under the same wordline, support circuitry and concepts as used in single bit EEPROM can be used as is known by a person skilled in the art. The sense amplifier circuitry of the two-bit memory cell should be able to distinguish between the unprogrammed and the programmed state of each bit as is done in case of single bit memory cells. The power supply circuit needed to supply the desired voltage levels and the logic circuitry needed to address and control the programming of the device can be similar to the circuits already used in single bit EEPROM devices.

In a first aspect of the invention a memory device and a method for manufacture this memory structure is disclosed.

Figure 1:
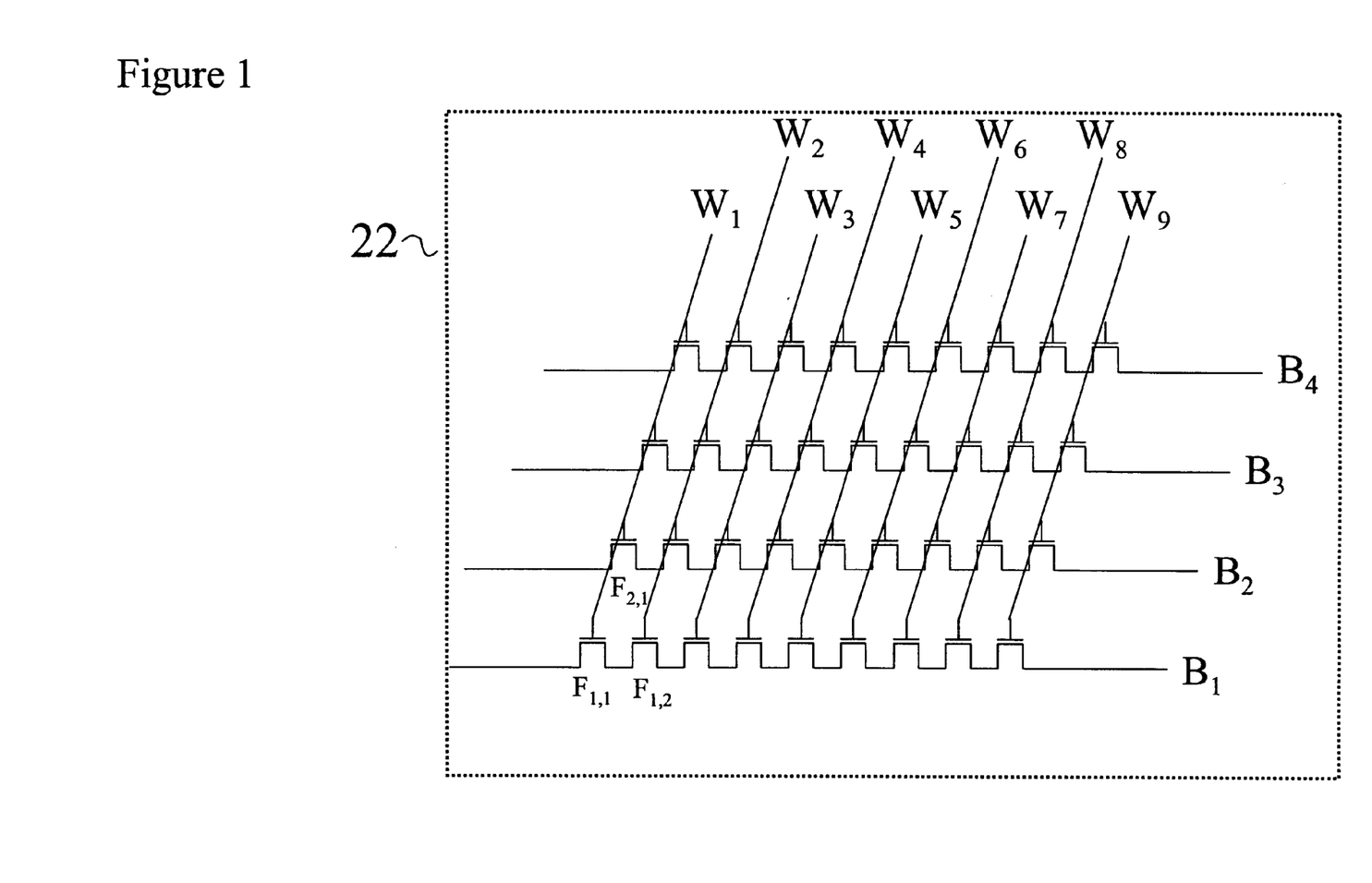
FIG. 1 is a schematic diagram of a non-volatile memory according to one embodiment of the invention.

A schematic diagram of a non-volatile memory (NVM) according to the invention is shown in FIG. 1. The memory matrix in this example shows 9 wordlines $W_i$, labelled from i=1 to 9, and 4 bitlines $B_j$, labelled from j=1 to 4. At the intersection of each wordline and bitline a field-effect transistor (FET) is present, capable of storing data at two electrically insulated storage points. Hence this FET can be described as a two-bit memory cell according to the present invention. Each FET or intersection is labeled $F_{i,j}$, with "i" being the wordline index and "j" being the bitline index. The array of (9×4)=36 structures, arranged in rows and columns according to the present invention, yields a memory matrix of (9×2=) 18 datawords of 4 bits each or 72 bits in total. In accordance with the present invention the non-volatile memory (22) may comprise an array of two-bit cells $F_{i,j}$, arranged in any number "j" of rows $B_j$ and any number "i" of columns $W_i$.

A schematic top view and a preferred process flow of the memory matrix (22) of FIG. 1 are given in FIGS. 2a–i. The memory cells or structures are fabricated in or on a semiconductor substrate (1). This semiconductor substrate is typically a silicon wafer. For the purpose of teaching the invention p-type wafers are used and n-type FET's are fabricated in and on these p-type wafers. It is obvious to a person skilled in the art that a memory structure according to the present invention can also be obtained by fabricating p-type FET structures on an n-type substrate or n-well. In FIGS. 2a–i the front-end-of-line (FEOL) process steps needed to create the memory structure (15) are disclosed. The process steps needed to form the interconnect circuitry, i.e. the back-end-of-line (BEOL) processing such as contacts, vias, metal lines and corresponding insulation layers, needed to address the individual memory cells $F_{i,j}$ are not discussed. Parallel with the fabrication of a memory structure according to the present invention other FET-based circuits such as logic circuitry, power control logic etc. can be formed, possible requiring some additional process steps, e.g. dedicated gate dielectrics for high voltage transistors. The formation of such peripheral circuits is also not discussed here.

Figure 2A:
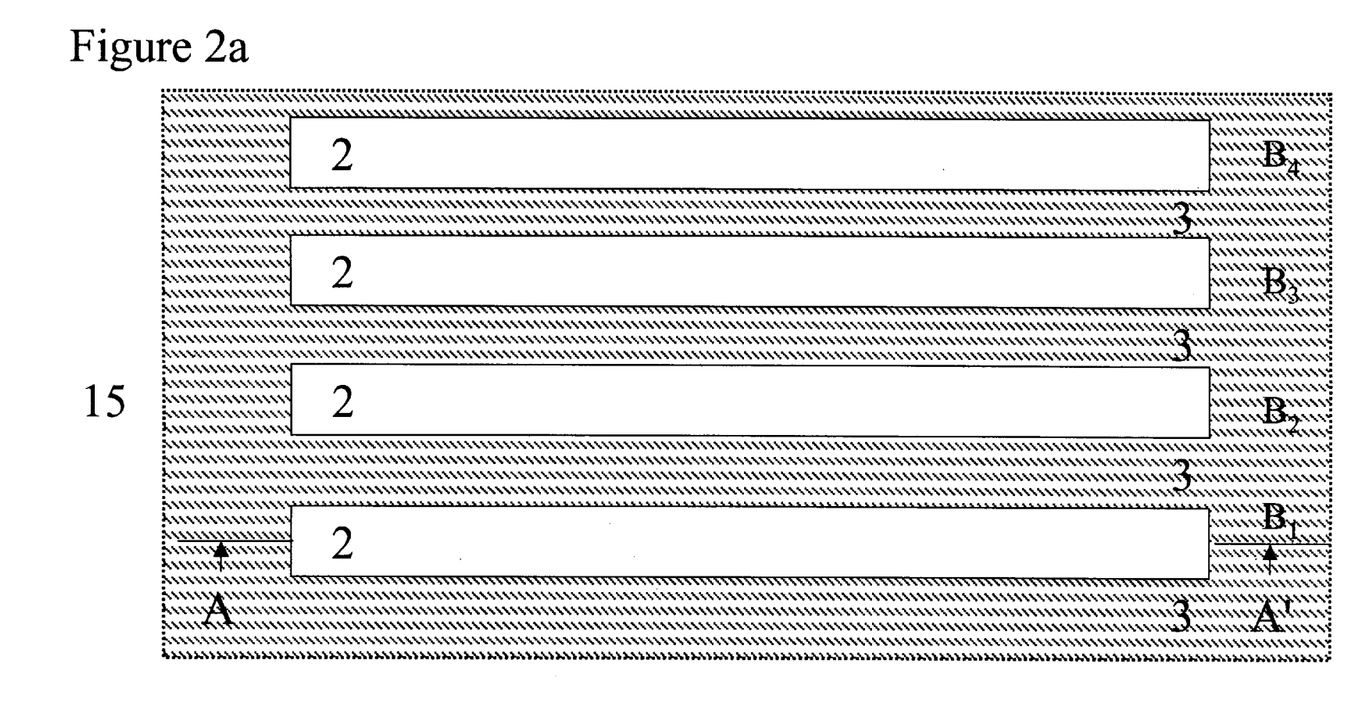
FIGS. 2a–j show schematic top views and a process flow of the memory matrix of FIG. 1, according to a preferred embodiment of the present invention.
Figure 2B:
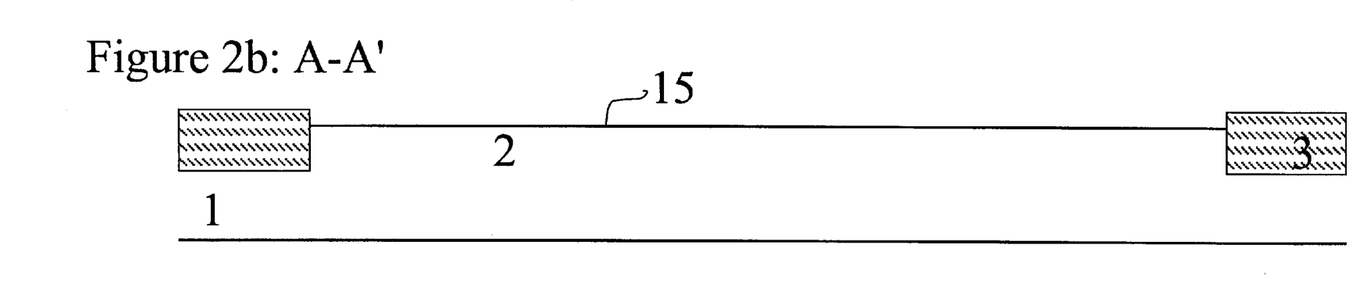

After providing the semiconductor substrate (1) a plurality of, substantially parallel, active area lines (2) is defined in a major surface (15) of the substrate (1), as shown in FIG. 2a. These active area lines (2) are separated and isolated from each other by field regions (3). Several techniques known in the art, such as LOCOS or Shallow Trench Insulation (STI) can be used to define the active area regions (2) and the interleaving field regions (3). FIG. 2b presents the cross-section A–A' along a bit line B1, showing the field regions (3) bordering the active area (2). The active area lines (2) will form the bit lines $B_j$ of the memory structure (22) illustrated in FIG. 1.

Figure 2C:
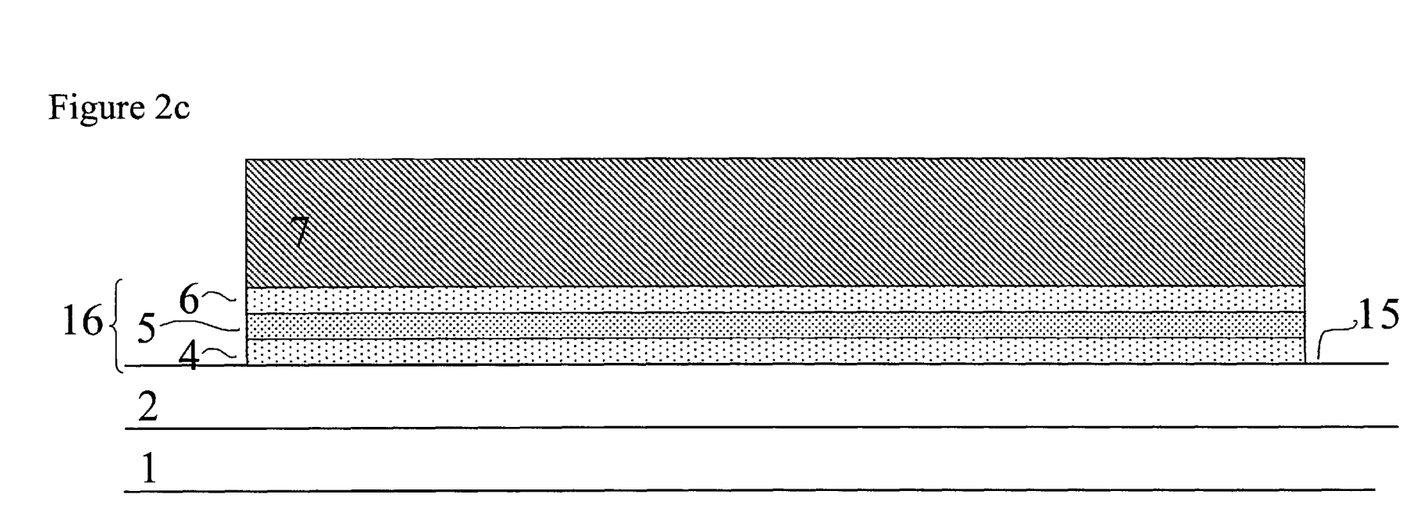
Figure 2D:
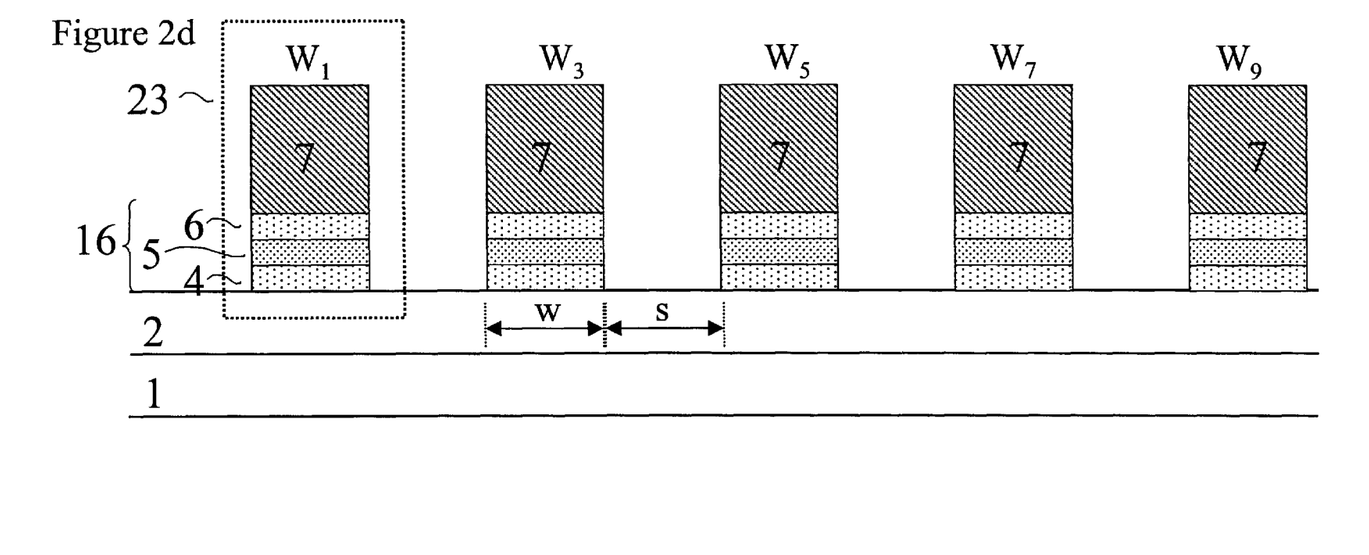

After the formation of the active area's (2) a first stack of layers is formed as shown in FIG. 2c. On top of the major surface (15) a stack of layers is deposited, preferably in a uniform way using chemical vapour deposition (CVD) methods, which are known to a person skilled in the art. This first stack of layers comprises a conductive top part (7) and a non-conductive bottom part (16). The conductive part (7) is typically constructed from polycrystalline silicon and is used as gate electrode to bias the FET structure. The non-conductive bottom part (16) should be capable of receiving charge carriers injected from the conductive top part (7) or from the active area below (2) and act as the gate dielectric of the FET structure. The non-conductive bottom part should be capable of storing and retaining charge carriers injected from the conductive top part (7) or from the active area below (2). The non-conductive bottom part (16) should be capable of locally storing and retaining charge injected to selected locations within this bottom part (16) and preventing diffusion or displacement of the injected charge within the nonconductive bottom part (7).

The non-conductive part (16) can be a sandwich of a first (4), a second (5) and a third (6) dielectric layer. The first (4) and third (6) dielectric layers are electrically insulating the middle layer (5), which is used as a charge trapping or charge-storing layer. The charge trapping layer can be a nitride layer where the non-conductive nitride layer is dimensioned such as to prevent dispersion of charge stored at different positions within the nitride layer, an oxide layer with buried separated polysilicon islands where the charge is stored within these conductive polysilicon islands, a layer comprising separated silicon microcristals, where the charge can be stored in these separated silicon microcrystals. The non-conductive bottom part (16) can be formed by depositing a first dielectric (4) on top of the major surface (15). This first dielectric (4) is typically silicon dioxide formed by thermal oxidation of the silicon substrate (1) or can be deposited by a variety of CVD (chemical vapour deposition) techniques, e.g. TEOS formed by Low Pressure CVD, oxides formed by Atomic Layer CVD. Typically the thickness of this first dielectric is between 4 and 20 nm. A second dielectric (5) is formed on top of the first dielectric (4), which electrically insulates this second dielectric (5) from the active area (2) underneath. Typically the second dielectric (5) is silicon nitride, having a thickness between 2 to 20 nm. On top of the second dielectric (5) a third dielectric layer (6) is formed, e.g. by CVD, which electrically insulates the second dielectric (5) from the conductive top part (7). Typically this third dielectric is silicon oxide having a thickness between 20 to 400 nm. In the thus formed ONO stack the nitride layer (5) provides the charge retention mechanism for programming the memory cell. On top of the third dielectric layer (6) a first conductive gate (7) is formed. Typically polycristalline silicon having a thickness ranging from 100 to 400 nanometer (nm), is used as gate material. In this example the first conductive gate (7) will be n-type doped, e.g. by Arsenic or Phosphorus ion implantation.

Figure 2E:
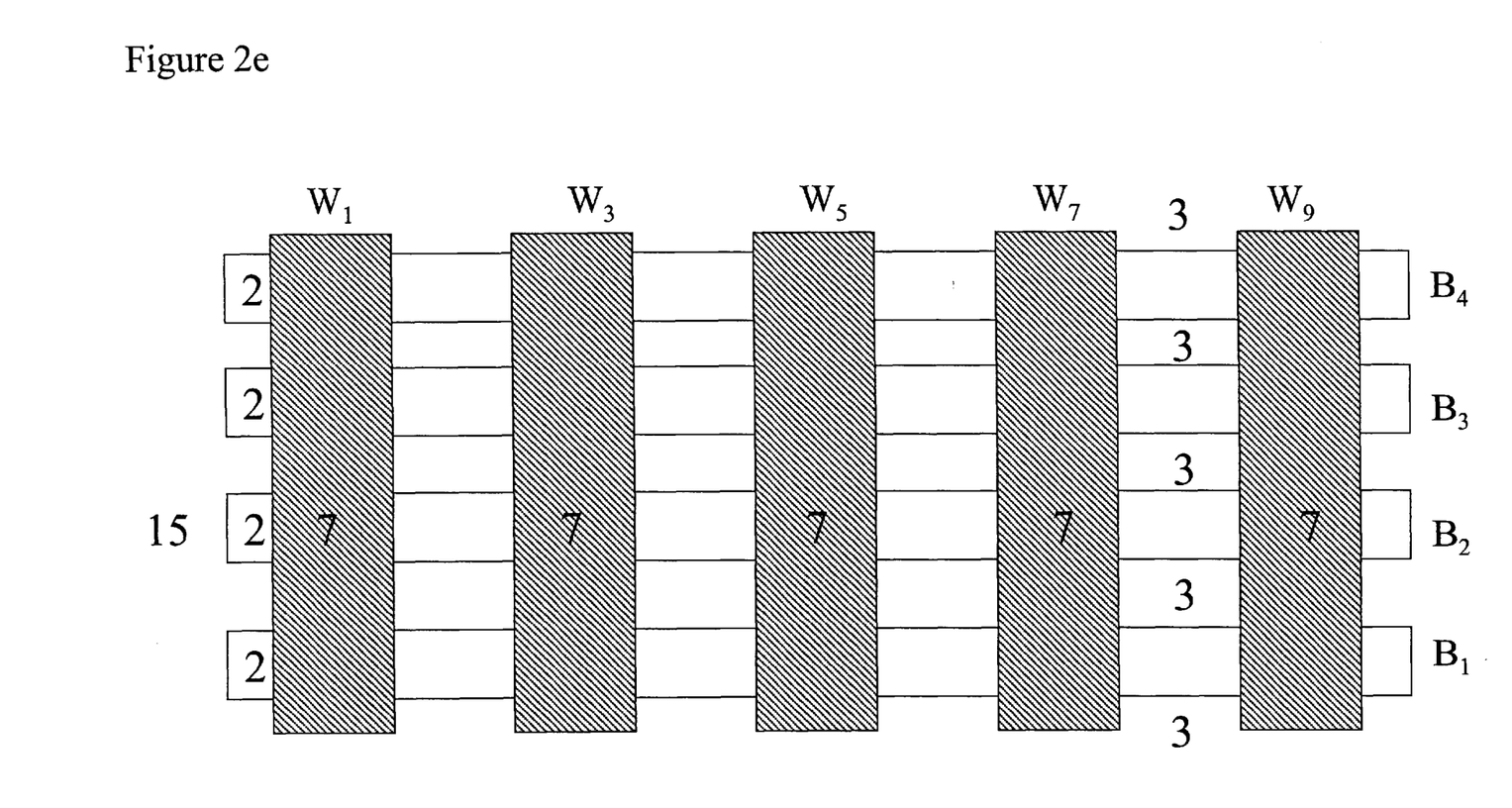

The deposited first stack of layers is patterned (see FIG. 2d) yielding the first cell stack (23) in such a way as to form a multitude or sequence of lines $W_i$ substantially perpendicular to the active area lines (2). Each set of lines or sequence comprises a number "i" of lines preferably placed at equidistant spacing. Preferably the width w of the first cell stacks (23) and the spacing s between these first cell stacks are of the same value. FIG. 2e shows a top view of such a set of "i=5" lines formed by patterning the first stack of layers (4,5,6,7). These patterned first cell stacks will form the first part of the word lines $W_i$ of the memory structure (22) illustrated in FIG. 1. The patterning of the stack of layers (3,4,5,7) is preferably done using known photolithographic and dry etching processes.

Figure 2F:
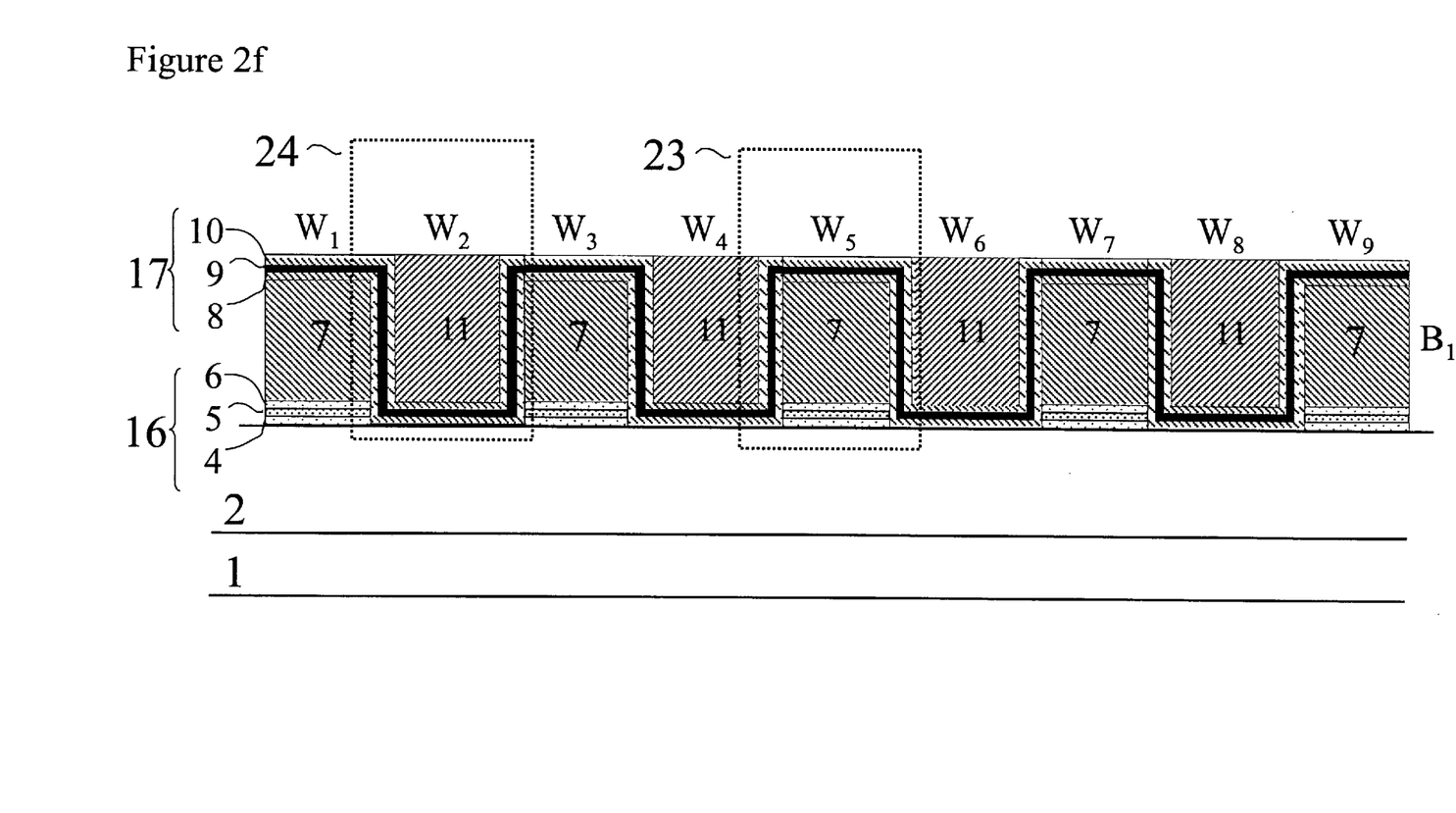

After patterning the first cell stack (23) a second stack of layers is formed as shown in FIG. 2f. The second cell stack (24) comprises again a non-conductive (17) and a conductive part (11). The non-conductive part (17) electrically insulates the second conductive layer or gate (11) from the first conductive gate (7) and from the underlying active area (2).

In a preferred embodiment illustrated in FIG. 2f, the non-conductive part (17) comprises a sandwich of 3 dielectric layers. The first (8) and third (10) dielectric of this second cell stack electrically insulates the middle layer (9), which is used as charge trapping layer. The second cell stack (24) can be formed by conformal depositing a first dielectric layer (8) on top of the patterned first stack. The exposed surfaces of the first gate stack (23) and of the active area in the spacing in between the first gate stack (23) will be covered by this first dielectric layer (9). This first dielectric (8) can be silicon oxide. On top of this first dielectric (8) a second, charge trapping, dielectric (9) is conformal deposited. The second dielectric (9) can be silicon nitride. A third dielectric (10), e.g. silicon oxide, is conformal deposited on top of the second dielectric (8). On top of this third dielectric the polycrystalline silicon gate layer (11) is deposited. In a preferred embodiment of the invention first dielectrics (4, 8) are of the same material, e.g. oxide. Second dielectrics (5,9) are of the same material, e.g. nitride. Third dielectrics (6,10) are of the same material, e.g. oxide. The gate layers (7,11) are also the same material, e.g. polycrystalline silicon.

Figure 2G:
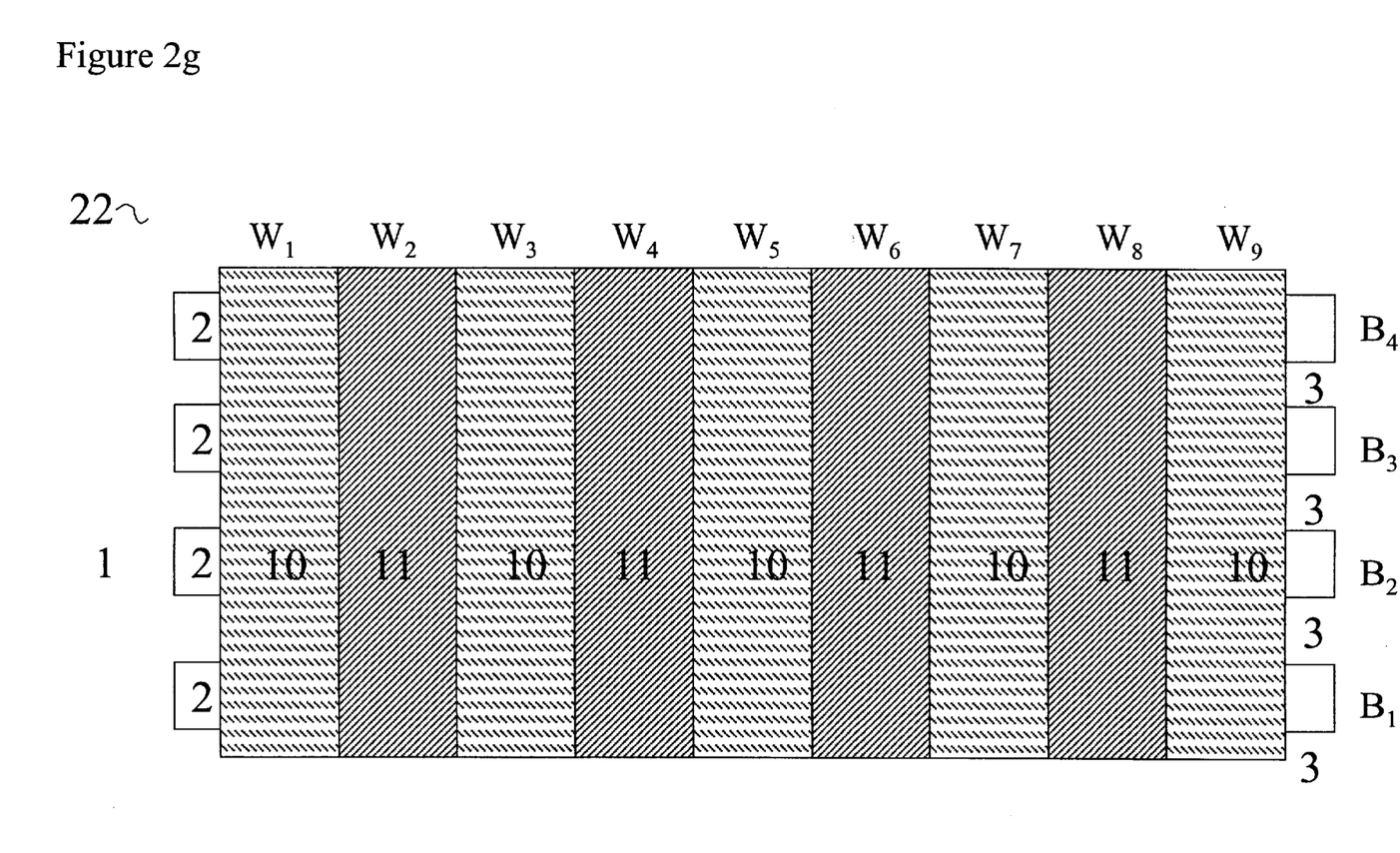
Figure 5:
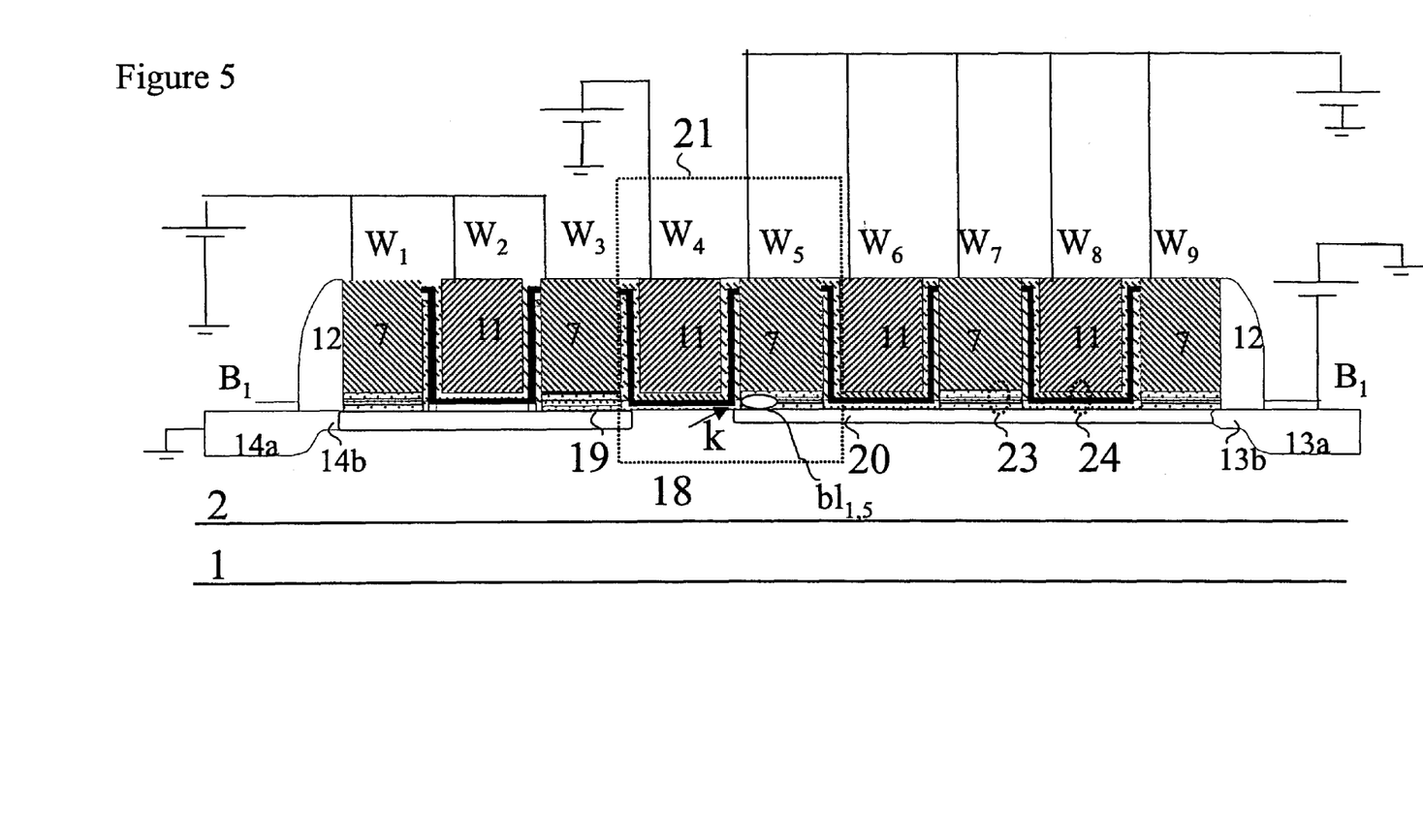
FIG. 5 is a cross section of the memory structure according to an embodiment of the present invention, during write operation.

This second stack of layers can be planarised by a variety of methods. One such method is using a CMP (Chemical Mechanical Polishing) process. The second poly layer (11) is polished using the second non-conductive layer (17) as polish-top layer. This second layer stack can be polished until the second non-conductive part (17) is exposed, as shown in FIG. 2f. In this case the non-conductive layer (17) of the second gate stack (24) is not only located between the conductive parts (7, 11) of the first (23) and the second gate (24) stack, but also on top of the first gate stack (23). The second layer can be polished until the first cell stack, more particularly the top gate layer (7) is exposed as is shown in FIG. 5. The second cell stack can also be formed by atomic layer depositing in which a layer can be selectively deposited on a substrate. After conformal depositing the non-conductive part (17) of the second stack the remaining gaps or equidistance spacings between the set of first cell stack lines (7) can be substantially filled by selectively depositing the second conductive layer (11) up to the level of the first cell stack. The top surface of the second stack (24) is at substantially the same level as the top surface of the first stack (23): the memory structure (22) of the present invention comprises hence a planar array of contiguous poly lines, alternated formed in one of the two poly-layers (7, 11). FIG. 2g shows a top view of the memory structure (22) of FIG. 2h with the dielectric layer (10) remaining on top of the first stack alternated by the second poly layer (11) of the second cell stack. Outside the memory structure the second stack is removed resulting in an interdigitated set of (2n−1) first and second cell stacks, with "n" being the number of patterned first stack lines in a set.

Figure 2H:
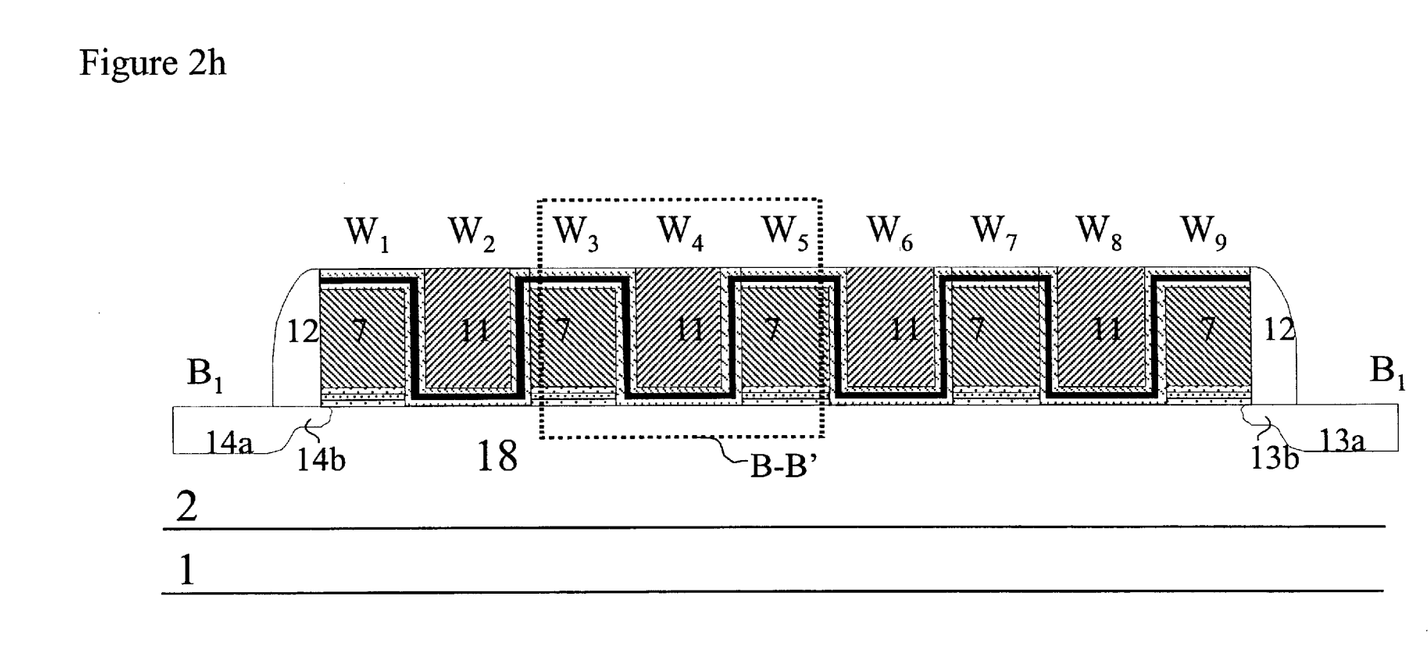
Figure 2I:
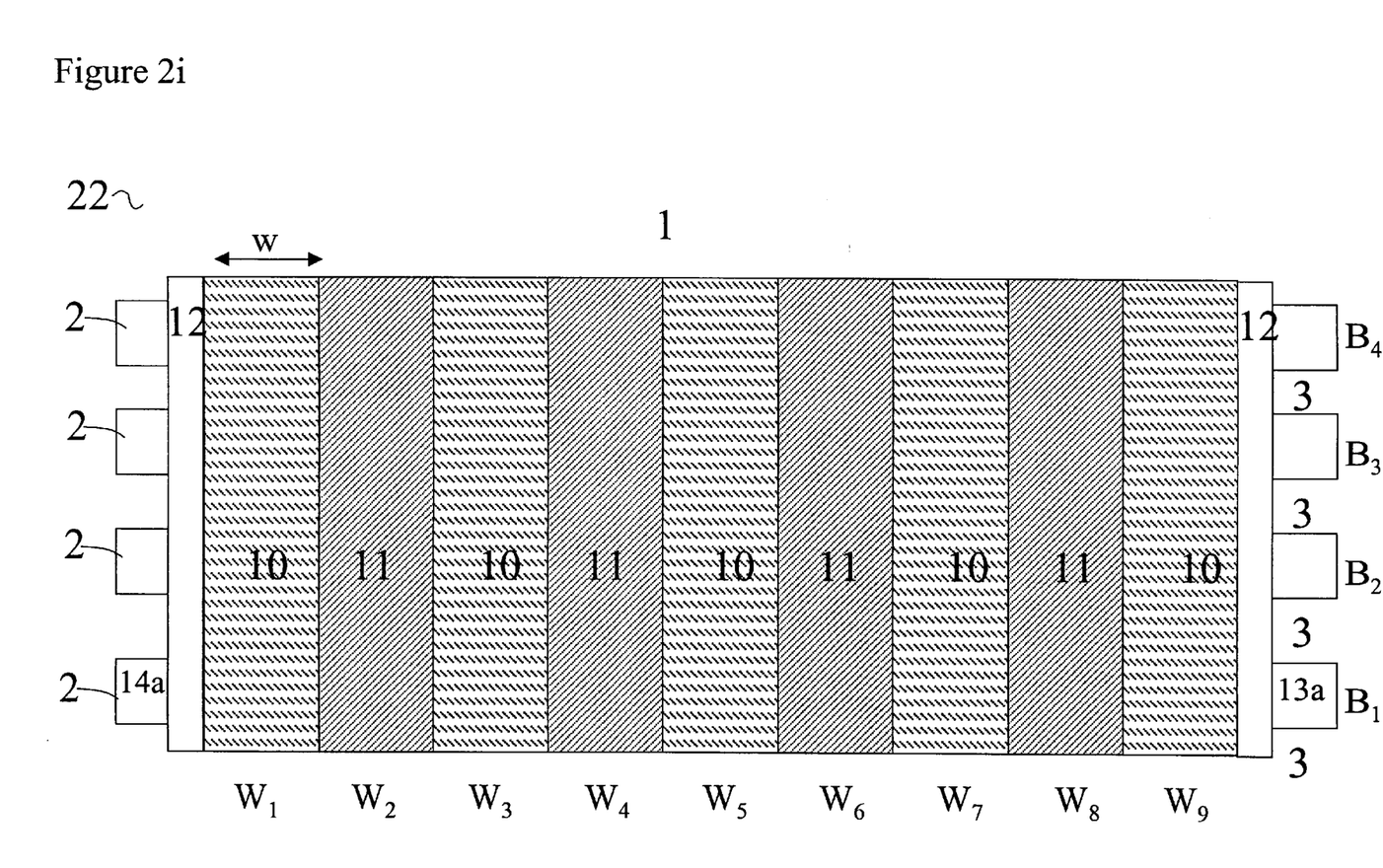

After forming by polishing the second stack of layers, the lines constituting the array of second cell stack (24), spacers (12) and junction regions can be formed in the active area at both sides of the array of first (7) and second (11) poly lines as shown in FIG. 2h. The source/drain junctions can be formed by first implanting lowly doped "LDD" regions (13a, 14a) self-aligned to the array of first and second polylines (7,11), then forming spacers (12) self-aligned to the array of first and second polylines (7,11) and finally implanting the highly doped junction regions (13b, 13a). During the implantation of the junctions the first and second polylines or gates (7,11) are also doped. FIG. 2i gives a top view of the device after formation of the spacers and junctions showing the array of patterned first and second cell stacks, one adjacent to another and electrically insulated from each other. One can see a grid of interspaced active area lines (2) and an array of abutted isolated cell stacks (23,24). Along the perimeter of the array of abutted cells or memory stacks, junctions are formed in the active area lines (2).

Figure 2J:
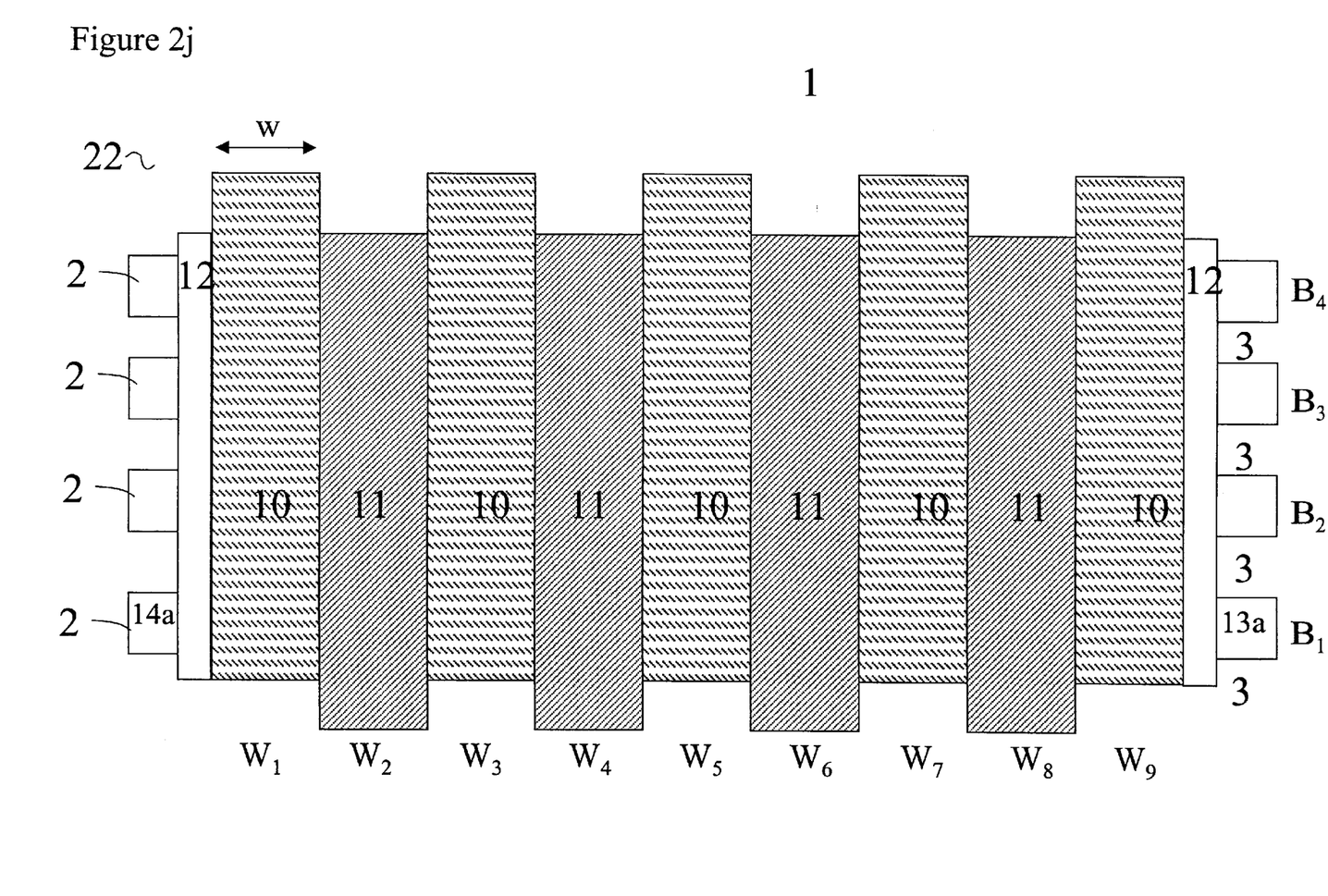

FIG. 2h shows the cross-section along bitline $B_1$ of a memory device according the present invention The memory structure comprises a set of (2n−1) wordlines $W_i$ and "j" bitlines $B_j$. In this example "n"=5, and "j"=4. Within one active area line, i.e. within a bitline, a chain of planar polylines is formed by an alternating and adjacent or adjoining sequence of a first and a second cell stack. Each cell stack comprises a conductive (7,11) and non-conductive part (16,17) and forms a FET structure. The non-conductive part (16,17) preferably comprises a second charge-trapping layer (5,9) sandwiched between a first (4,8) and a third (6,10) dielectric. Adjoining cell stacks are electrically insulated from each other, preferably by the second non-conductive part (17). This array of cell stacks is terminated at both ends by spacers (12) and self-aligned source/drain regions (13, 14). In between the source/drain regions a channel region (18) is formed in the substrate (1). FIG. 2i shows the top view of the device having its cross-section detailed in FIG. 2h. As illustrated in FIG. 2j the adjacent polylines do not have to be aligned. For contacting purposes the layout of FIG. 2j is more appropriate. Although the polylines of both stacks have the substantially the same width and length, the polylines are indented relative to each-other. The polylines of one stack are shifted relative in longitudinal direction to the polylines of the other stack. This way part of a polyline extend beyond its neighbouring polylines and hence there is more area available to create the contacting structures.

Figure 3:
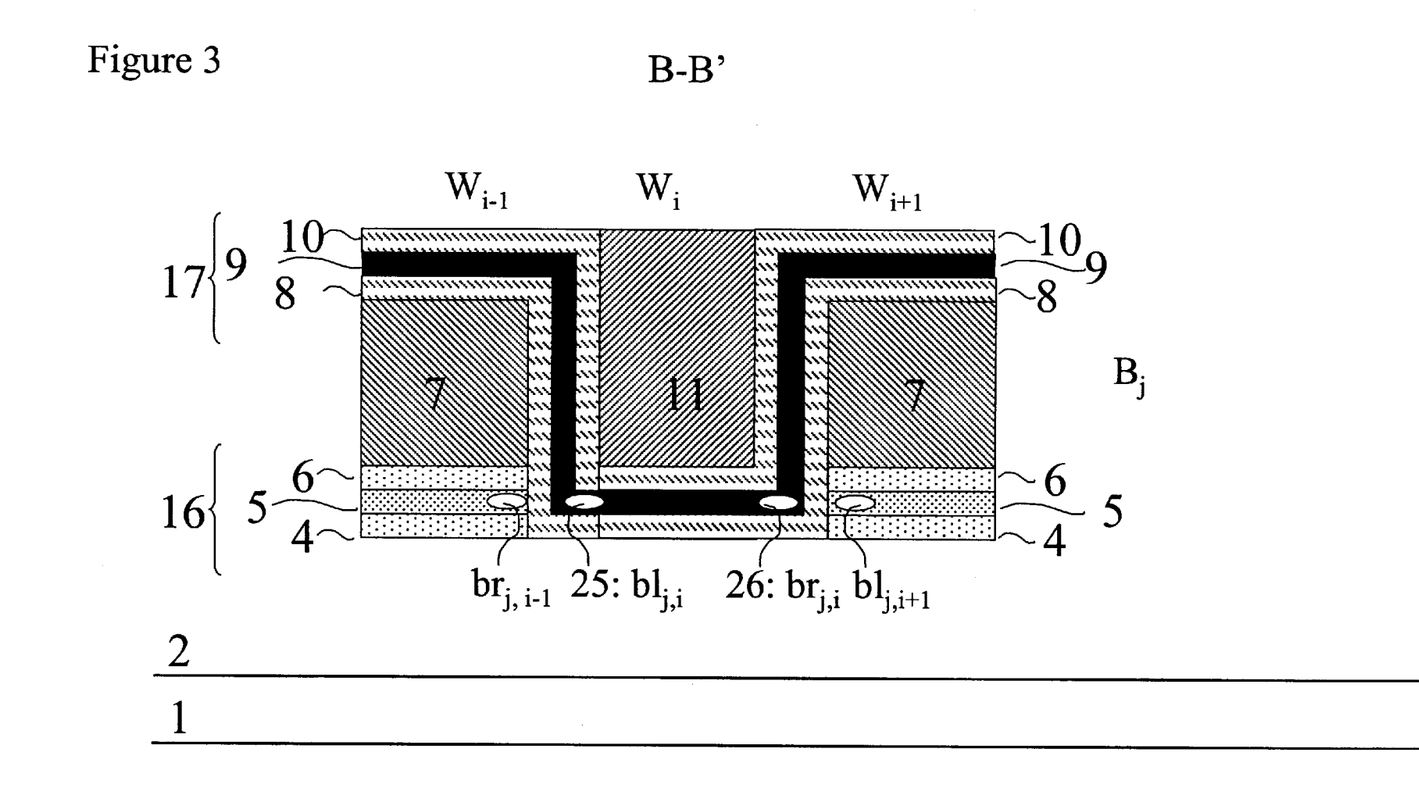
FIG. 3 shows a detailed cross-section B–B' of FIG. 2h according to an embodiment of the present invention.

FIG. 3 shows a detailed section B–B' at wordline "i=4" and bitline "j=1" of FIG. 2h. In the non-conductive part (17) underneath wordline $W_4$ two bits can be stored, respectively on the left (25) and on the right (26) side of the middle dielectric layer (9). The right bit (26) is labelled "$br_{1,4}$" while the left bit (25) is labelled $bl_{1,4}$. Because of the non-conductive character of the nitride layer (9), used as charge-trapping layer in a preferred embodiment, the charge stored at a given location, e.g. at left or right underneath the wordline, will essentially not diffuse or be dispersed within this charge-trapping layer. The electrical separation of the two bits in a wordline depends on the width of the wordline being the width of the first polyline (7) or the spacing between the first polyline (7), which defines the width of the second polyline (11). Hence such cell can retain the localized charge. As shown in FIG. 3 the dielectric layer 8 electrically isolates the left bit of wordline "i=4" from the right bit of wordline "i−1=3", although both localized charges are close to each other.

Figure 4:
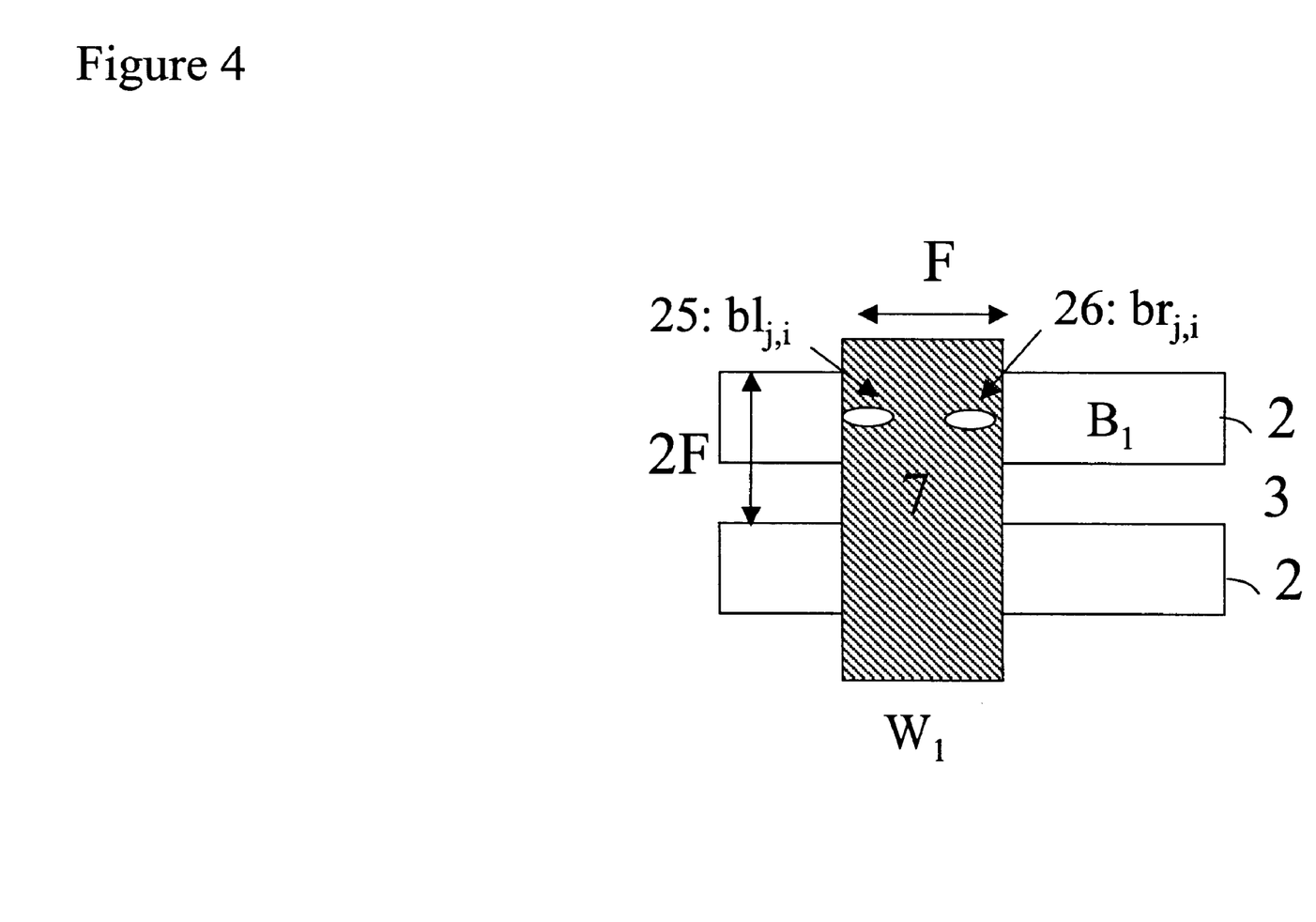
FIG. 4 is a schematic layout of EEPROM memory cell according to one embodiment of the present invention.

FIG. 4 shows the elementary memory cell comprising 2 interspaced active area lines (2) used as bit lines and a cell stack comprising a conductive gate (7) and a charge-storing dielectric (5), perpendicular to the active area lines(2)., the minimal area required to store a single bit is $F^2$ for a minimum feature size F. The minimal gate length and hence the width of each wordline is F, while the width of and the spacing between the active area lines is also F. Within each intersection of a wordline $W_i$ and a bitline $B_j$ two bits of data can stored yielding two bits data per $2F^2$ area.

In a second aspect of the invention, methods for programming, reading and erasing the memory structure according to the present invention are disclosed. It is important to note that the two-bit memory cell of the present invention is a symmetrical device. As is common practice in semiconductor devices the term "source" or "drain" is used to identify the junction regions at opposite sides of a gate stack or array of gate stacks. Depending of which of the two bits of the present cell is being addressed the biasing of the "source" and "drain" terminals is made appropriate. If the right bit is being addressed, the left junction is used as source terminal and the right junction as drain terminal. If the left bit is being addressed, the right junction is used as source terminal, while the right junction is being used as drain terminal. In the remainder of the text the term "source terminal" identifies the left junction, while the term "drain terminal" identifies the right junction. A junction (13,14) may comprise a lowly (13a,14a) and a highly doped part (13b,14b). This doped regions (13,14) can be also be labelled as hard junctions, because the concentration of the mobile charge carriers in these doped regions (13,14) is, in normal operating conditions, to a large extent independent of the applied voltages. FIG. 5 shows a cross section along a bit line of a memory structure according to the present invention. In order to teach the invention the programming (writing), reading and erasing of wordline 4 will be explained using the connection scheme as illustrated in FIG. 5.

In a first embodiment of the second aspect the programming of the memory structure is disclosed.

Charge can be stored in a memory structure according to the present invention consisting of 2n−1 wordlines at 4(n−1) places, i.e. at the right side of the first wordline, at the left and right side of wordlines 2 to 2n−2 and at the left side of wordline 2n−1. In the bitline $B_1$ shown in FIG. 2h 1 bit can stored at the right side of wordline $W_1$, the left side of wordline $W_9$ and on the left and right side of wordline $W_2$ to $W_8$. As explained below no charge can be stored in the left position underneath the first wordline $W_1$ and in the right position underneath the last wordline $W_9$.

The memory is programmed, i.e. electric charge is placed in 1 of the 4(n−1) available storage places using the source side injection mechnanism (SSI). FIG. 5 illustrates the mechanism of storing data at a charge storage point, i.e. writing a bit $bl_{1,5}$ to the left side of wordline 5.

1. The left junction which is the same side as the bit to be programmed, i.e. the source (14) is grounded, being the source potential.
2. A potential is placed on the right junction, which is at the opposite site of the bit to be programmed, i.e. the drain (13), being the drain potential, e.g. 5V.
3. The wordlines on the left of wordline 5, i.e. wordline 1 to 3, are biased at a positive voltage, e.g. 5V. The applied voltage is large enough to invert that part of the channel (18) underneath these wordlines thereby creating a virtual source (19) to the FET structure of wordline 4. The potential of source (14) is coupled to the left of wordline 4 as this inverted part of the channel extends from the hard junction (14) to the left of wordline 4.
4. The wordlines 5 to 9, are biased at a positive voltage, e.g. 6V. The wordlines are biased at a voltage higher than the voltage applied to the drain (13). The applied voltage is large enough to invert that part of the channel (18) underneath these wordlines thereby creating a virtual drain (20) to the FET structure of wordline 4, extending from the hard drain junction (13) to the right of wordline 4. The potential of source (14) is coupled to the left of wordline 4. As a result from step 3 and 4 all wordlines are biased to invert the channel region underneath, except wordline 4. This wordline 4 is adjacent the bit to be programmed.
5. Wordline 4 is biased at a moderate voltage, e.g. slightly above the thresholdvoltage of the FET structure, sufficiently high to turn on the channel under wordline 4.
6. Wordline 4 and wordline 5 form a split gate structure, having a virtual source (19) and a virtual drain (20). Carriers are flowing from the virtual source to the virtual drain. The applied voltages now create a high lateral electric field at the virtual drain and a high vertical electric field from the virtual drain to wordline 5. The lateral field generates a high amount of hot carriers. The generated hot carriers are attracted by the vertical field and injected in the dielectric above the virtual drain as shown by arrow k in FIG. 5. The injected carriers are trapped by and stored in the storage region $bl_{1,5}$ located inside the dielectric (5) above the virtual drain. The threshold voltage of memory cell of wordline 5 at the selected bitline will change as function of the amount of charge injected and stored.

More generally speaking the mechanism of writing data to a specific charge storage point can be described as follows: To inject charge at the left side of wordline i, i ranging from 2 to 2n−1:

1. The first junction, e.g. (14), is grounded, being the source potential.
2. A drain potential is placed on the second junction, e.g. (13).
3. If i≧3 then wordlines 1 to i−2 are biased at a positive voltage in order to couple the source potential to the virtual source (19), being the part of the channel (18) located at the left side under wordline i−1.
4. wordlines i to 2n−1 are biased at a positive voltage in order to couple the drain potential to the virtual drain (20), being that part of the channel (18) located at the right side under wordline i.
5. wordline i−1 is biased at a moderate voltage, sufficiently high to turn on the channel under wordline i−1.

The applied voltages now create a high lateral electric field at the virtual drain and a high vertical electric field from the virtual drain to wordline i. The lateral field generates a high amount of hot carriers. The generated hot carriers are attracted by the vertical field and injected in the dielectric above the virtual drain. The injected carriers are trapped by and stored in the storage dielectric located inside the dielectric above the virtual drain.

To inject charge at the right side of wordline i, i ranging from 1 to 2n−2:
1. The second junction (13) is grounded, being the source potential.
2. A drain potential, i.e. a high voltage, is placed on the first junction (14).
3. If i≦2n−3 then wordlines i+2 to 2n−1 are biased at a positive voltage in order to couple the source potential (13) to the virtual source (20), being the part of the channel (18) located at the right side under wordline i+1.
4. wordlines 1 to i are biased at a positive voltage in order to couple the drain potential (14) to the virtual drain (19), being that part of the channel (18) located at the right side under wordline i.
5. wordline i+1 is biased at a moderate voltage, sufficiently high to turn on the channel under wordline i+1.

The applied voltages now create a high lateral electric field at the virtual drain and a high vertical electric field from the virtual drain to wordline i. The lateral field generates a high amount of hot carriers. The generated hot carriers are attracted by the vertical field and injected in the dielectric above the virtual drain. The injected carriers are trapped by and stored in the storage dielectric located inside the dielectric above the virtual drain.

In a second embodiment of the second aspect the erasing of the memory structure is disclosed.

If an n-type active area is used, the selected bit is programmed by injecting holes into the dielectric above the virtual drain by creating, where appropriate, p-type channels underneath the cell stack and these injected holes are stored in the programmed bit. For such p-channel memories in a preferred embodiment the programmed bit is erased to introduce electrons into the programmed bit to compensate and annihilate the stored positive charge. In order to erase the cell all wordlines are placed at a high negative potential, while the source (14) and drain (13) junctions are grounded or biased positive. Electrons will in this case tunnel from the conductive part (7, 11) of the cell stacks (23, 24) through the dielectric (6, 10) towards the charge-storing dielectric (5, 9). If no charge is stored in a node, the electric field in the dielectrics under (4,6) and above (8,10) the node are equal and the amount of charge at this node will not change. If charge is stored in a node, i.e. one of the two storage points (25, 26) within a cell stack (23, 24), the electric field under the node will be larger than the electric field above the node.

If the field is sufficiently high, electrons can tunnel through the dielectric under the field towards the silicon. This electron tunnelling will continue until all charge is removed from the storage node.

In an alternative embodiment, the memory structure is erased by injecting hot hole from the virtual drain to compensate the locally stored charge. A bit selective erase can be done using hot hole injection at the drain. To induce hot hole injection, conditions to induce band-to-band tunneling have to be applied.

To erase the charge positioned at the right side of word line i, the following sequence will be applied:
1. The second junction (13), which is at a same side as the bit to be erased, is biased at a high potential: the erase potential.
2. Wordlines i+1 to 2n−1 are biased at a high potential in order to pass the erase potential to the virtual drain (20), i.e. a conductive channel is formed in the substrate to extend the second junction (13) adjacent to the wordline that will be erased. All wordlines between the selected wordline i and the junction at the same side of the bit to be erased are biased to invert the channel region underneath.
3. The selected wordline i is biased at negative potential.

With these applied conditions, the channel under wordline i+1 is in strong inversion and at high potential. The channel under wordline i is in strong accumulation and at the potential of the bulk. The high electric field at the virtual drain induces band-to-band tunneling. The high potential difference between virtual drain and bulk accelerates the tunneling electrons and induces impact ionizations. The generated holes are accelerated towards wordline i by the vertical field created by the negative potential on wordline i.

To erase the charge positioned at the left side of word line i, the following sequence will be applied:
1. The first junction (14) is biased at a high potential: the erase potential
2. Wordlines 1 to i−1 are biased at high potential in order to pass the erase potential to the virtual drain (19).
3. Wordline i is biased at negative potential.

With these applied conditions, the channel under wordline i+1 is in strong inversion and at high potential. The channel under wordline i is in strong accumulation and at the potential of the bulk. The high electric field at the virtual drain induces band-to-band tunneling. The high potential difference between virtual drain and bulk accelerates the tunneling electrons and induces impact ionizations. The generated holes are accelerated towards wordline i by the vertical field created by the negative potential on wordline i.

In a third embodiment of the second aspect the reading-out of the memory structure is disclosed.

The information stored at the left side of a gate, e.g. selected wordline i, is read out by biasing the first junction (14) at the same side as the programmed bit, to ground and biasing the other junction (13), at the side opposite the programmed bit, at a low potential. All wordlines except selected wordline i are biased are at high potential to invert the channel region underneath these biased worldlines. These voltages couples the potential of the first junction (e.g. 14) to the virtual source (19) at the left side of wordline i, and to pass the potential of the second junction (e.g. 13) to the virtual drain (20) at the right side of wordline i. Charge located in the programmed bit near the virtual source (19) will result in a large increase of the threshold voltage as measured at wordline i, charge located near the virtual drain will result in a small increase of the threshold voltage as measured at wordline i. Hence if charge is stored at the left side of the selected gate the threshold voltage of the memory cell is changed accordingly and the current flowing trough the corresponding channel region is affected. Hence by sensing the current controlled by the selected memory cell the presence of a certain amount of charge can be detected.

Readout of the information stored at the right side of a gate is read out by biasing the second junction (13) at ground and biasing the first junction (14) at a low potential. All wordlines except wordline i are biased at high potential. These biases are coupling the potential of the second junction (13) to the virtual source (20) at the right side of wordline i, and to pass the potential of the first junction (14) to the virtual drain (19) at the left side of wordline i. Charge located near the virtual source (20) will result in a large increase of the threshold voltage as measured on wordline i, charge located near the virtual drain (19) will result in a small increase of the threshold voltage as measured on wordline i.

What is claimed is:

1. An array of two-bit non-volatile memory cells comprising:
    a first sequence of parallel isolated active area regions formed in a substrate,
    a second sequence of planar adjoining cell stacks, said second sequence of planar adjoining cell stacks being positioned above and substantially perpendicular to said first sequence of parallel isolated active area regions; and,
    said planar adjoining cell stacks being isolated from each other and being alternately formed in a first stack of layers and in a second stack of layers.

2. An array as claimed in claim 1 wherein said first and said second stack of layers further comprise a conductive and a non-conductive part, said non-conductive part being at least in contact with said first sequence of parallel isolated active area regions and, wherein said non-conductive part isolates said planar adjoining gate stacks from each other.

3. An array as claimed in claim 2 wherein said non-conductive part comprises a sandwich of a first dielectric, a second dielectric and a third dielectric.

4. An array as claimed in claim 3 wherein said first dielectric and said third dielectric are of the same material and said second dielectric is capable of holding selected charge in portions thereof.

5. An array as claimed in claim 4 wherein said second dielectric is formed of nitride, said nitride being capable of holding said selected charge in selected regions thereof.

6. An array as claimed in claim 4 wherein said second dielectric is an oxide layer comprising embedded regions of polysilicon, each of said embedded regions of polysilicon being capable of holding said selected charge.

7. An array as claimed in claim 4 wherein said second dielectric comprises silicon microcrystals, each of said silicon microcrystals being capable of holding said selected charge.

8. An array as claimed in claim 3 wherein said non-conductive part isolating said planar adjoining gate stacks from each other is the non-conductive part of said second stack of layers and said non-conductive part further overlaps said conductive part of said first stack of layers.

9. An array as claimed in claim 8 wherein said non-conductive part overlapping said conductive part of said first stack of layers is a polish-stop layer.

10. A method for programming, reading and erasing a bit in a two-bit memory cell stack, in an array of two-bit non-volatile memory cells,
    said array comprising a first sequence of parallel isolated active area regions formed in a substrat, a second sequence of planar adjoining cell stacks, being positioned above and substantially perpendicular to said first sequence of parallel isolated active area regions, junctions formed self-aligned to and at opposite sides of said second sequence of planar adjoining cell stacks, said planar adjoining cell stacks being isolated from each other and comprising a conductive gate and a charge-storing dielectric layer, sandwiched between two dielectric layers, and comprising two regions, each region capable of storing 1 bit,
    said method comprising the steps of:
        selecting a memory cell stack;
        programming in a forward direction a bit in one of said two regions of said memory cell stack, the step of programming comprising:
            grounding one junction, positioned at the same side as said one of said two regions and applying a high potential to a junction, positioned at the opposite side of said one of said two regions;
            applying a high voltage to all cell stacks except to the cell stack neighbouring said one of said two regions to invert the active area regions underneath said biased cell stacks; and,
            biasing said neighbouring cell stack at a voltage slightly above the threshold voltage of said neighbouring cell stack to thereby inject electrical charge of a first type into said one of said two regions such that the threshold voltage of said selected cell stack is at least at predetermined level when said memory cell stack is read in the same direction from which it was programmed;
        reading said programmed bit in forward direction, the step of reading comprising:
            grounding said junction, positioned at the same side as said one of said two regions and applying a low potential to said junction, positioned at the opposite side of said one of said two regions;
            applying a high voltage on all cell stacks except to said selected memory cell stack to invert the active area regions underneath said biased cell stacks; and,
            sensing to what extent the threshold voltage of said selected memory cell is changed by said injected electrical charge.

11. The method of forming an array as claimed in claim 10 wherein the first sequence of parallel isolated active area regions comprises a first sequence of parallel isolated n-type active area regions, and
    further comprising the step of:
        erasing said programmed bit, the step of erasing comprising:
            biasing all cell stacks to a large voltage of a first sign;
            biasing said junctions to a voltage of an opposite sign that is zero volt or larger; and,
            tunneling negative electrical charge through one of said two dielectric layers, at least into said one of said two regions.

* * * * *